United States Patent
Raab et al.

(10) Patent No.: US 6,686,015 B2
(45) Date of Patent: Feb. 3, 2004

(54) TRANSFERABLE RESILIENT ELEMENT FOR PACKAGING OF A SEMICONDUCTOR CHIP AND METHOD THEREFOR

(75) Inventors: Kurt Raab, San Jose, CA (US); John W. Smith, Palo Alto, CA (US)

(73) Assignee: Tessera, Inc., San Jose, CA (US)

(*) Notice: Subject to any disclaimer, the term of this patent is extended or adjusted under 35 U.S.C. 154(b) by 10 days.

(21) Appl. No.: 09/885,684

(22) Filed: Jun. 20, 2001

(65) Prior Publication Data

US 2002/0007904 A1 Jan. 24, 2002

Related U.S. Application Data (62) Division of application No. 08/879,922, filed on Jun. 20, 1997, now Pat. No. 6,294,040.
(60) Provisional application No. 60/032,960, filed on Dec. 13, 1996, and provisional application No. 60/032,722, filed on Dec. 13, 1996.

(51) Int. Cl.[7] .................................................. B32B 3/00
(52) U.S. Cl. ..................... 428/40.1; 174/52.1; 428/41.4; 428/41.5; 428/41.7; 428/41.8; 428/42.1; 428/201; 428/202
(58) Field of Search ................................. 428/40.1, 41.4, 428/41.5, 41.7, 41.8, 42.1, 201, 202; 174/52.1

(56) References Cited

U.S. PATENT DOCUMENTS

| | | | |
|---|---|---|---|
| 3,614,832 A | 10/1971 | Chance et al. | 29/831 |
| 3,680,037 A | 7/1972 | Nellis et al. | 439/591 |
| 3,795,037 A | 3/1974 | Luttmer | 29/883 |
| 4,190,855 A | 2/1980 | Inoue | 257/668 |
| 4,237,607 A | 12/1980 | Ohao | 29/840 |
| 4,300,153 A | 11/1981 | Hayakawa et al. | 257/668 |
| 4,381,602 A | 5/1983 | McIver | 29/840 |
| 4,396,936 A | 8/1983 | McIver et al. | 174/252 |
| 4,545,610 A | 10/1985 | Lakritz et al. | 438/125 |
| 4,604,644 A | 8/1986 | Beckham et al. | 257/737 |
| 4,642,889 A | 2/1987 | Grabbe | 29/840 |
| 4,710,798 A | 12/1987 | Marcantonio | 257/777 |
| 4,793,814 A | 12/1988 | Zifcak et al. | 439/66 |
| 4,955,132 A | 9/1990 | Ozawa | 29/840 |
| 5,110,388 A | 5/1992 | Komiyama et al. | 438/502 |

(List continued on next page.)

FOREIGN PATENT DOCUMENTS

| | | |
|---|---|---|
| JP | 1-164054 | 12/1987 |
| JP | 1-253926 | 4/1988 |
| JP | 1-155633 | 6/1989 |
| JP | 1-278755 | 11/1989 |
| JP | 2-56941 | 2/1990 |
| JP | 4-91443 | 3/1992 |
| JP | 4-137641 | 5/1992 |
| RU | 1003-396 A | 8/1980 |
| WO | 94/03036 | 2/1994 |

Primary Examiner—Nasser Ahmad
(74) Attorney, Agent, or Firm—Lerner, David, Littenberg, Krumholz & Mentlik, LLP (57) ABSTRACT

A transferable resilient element assembly for fabricating a microelectronic package includes a first liner having a tacky material and a plurality of resilient elements, the plurality of resilient elements having a first surface being in contact with the the first liner. The plurality of resilient elements adhere to the tacky material so that upon removal of the plurality of resilient elements from the liner, the tacky material will adhere to the plurality of resilient elements and provide a tacky surface thereon.

23 Claims, 6 Drawing Sheets

U.S. PATENT DOCUMENTS

| | | | |
|---|---|---|---|
| 5,140,404 A | 8/1992 | Fogal et al. ................. | 257/783 |
| 5,148,265 A | 9/1992 | Khandros et al. ........... | 257/783 |
| 5,148,266 A | 9/1992 | Khandros et al. ........... | 257/773 |
| 5,194,930 A | 3/1993 | Papathomas et al. ....... | 257/773 |
| 5,203,076 A | 4/1993 | Banerji et al. ................ | 29/840 |
| 5,221,642 A | 6/1993 | Burns ......................... | 156/233 |
| 5,225,966 A | 7/1993 | Basavanhally et al. ..... | 261/774 |
| 5,249,101 A | 9/1993 | Frey et al. ................... | 361/717 |
| 5,265,329 A | 11/1993 | Jones et al. .................. | 29/832 |
| 5,316,788 A | 5/1994 | Dibble et al. ................ | 427/98 |
| 5,355,283 A | 10/1994 | Marrs et al. ................ | 361/760 |
| 5,414,298 A | 5/1995 | Grube et al. ................ | 257/690 |
| 5,431,571 A | 7/1995 | Hanrahan et al. ............. | 439/91 |
| 5,477,611 A | 12/1995 | Sweis et al. .................. | 29/840 |
| 5,548,091 A | 8/1996 | DiStefano et al. .......... | 174/260 |
| 5,563,445 A | 10/1996 | Iijima et al. ................. | 257/698 |
| 5,659,952 A | 8/1997 | Kovacs et al. ................ | 29/840 |
| 5,679,977 A | 10/1997 | Khandros et al. ........... | 257/692 |
| 5,706,174 A | 1/1998 | DiStefano et al. .......... | 361/749 |
| 5,773,561 A * | 6/1998 | Sachdev et al. ............. | 528/583 |
| 5,808,874 A | 9/1998 | Smith ......................... | 361/769 |
| 5,834,339 A | 11/1998 | DiStefano et al. .......... | 438/125 |
| 5,915,170 A | 6/1999 | Raab et al. ................ | 438/118 |
| 6,030,856 A * | 2/2000 | DiStefano ................... | 438/117 |

* cited by examiner

TRANSFERABLE RESILIENT ELEMENT FOR PACKAGING OF A SEMICONDUCTOR CHIP AND METHOD THEREFOR

CROSS REFERENCE TO RELATED APPLICATIONS

This application is a divisional of U.S. application Ser. No. 08/879,922, filed Jun. 20, 1997 now U.S. Pat. No. 6,294,040. This application claims benefit of U.S. Provisional Patent Application Ser. No. 60/032,960 filed Dec. 13, 1996, the disclosure of which is incorporated herein by reference. The present application relates to copending, commonly assigned U.S. Provisional Patent Application Ser. No. 60/032,722 filed Dec. 13, 1996, the disclosure of which is incorporated herein by reference.

FIELD OF THE INVENTION

The present invention relates, generally, to the field of microelectronic packaging, and more particularly relates to provision of a compliant interface between microelectronic elements such as a semiconductor chip and substrate.

BACKGROUND OF THE INVENTION

Designers and manufacturers of electronic devices are continually searching for ways to reduce the size of electronic components. Some recent developments involve the use of solder connections for electrically interconnecting semiconductor chips to printed circuit boards ("PCB") in order to use the space on the PCB more efficiently. Solder connections have proven to be somewhat effective; however, the differences in thermal expansion and contraction ("thermal mismatch") between the semiconductor chip and the PCB places a great amount of stress on the solder and may adversely effect the integrity of the numerous solder bonds required to make an electrical connection. Warpage of either the semiconductor chip or the PCB may also have a negative effect on the integrity of the solder connections.

There have been a number of prior art solutions attempting to reduce the stress on solder joints caused by thermal mismatch. One solution put forth in U.S. Pat. No. 4,642,889 teaches embedding wires within each solder column to reinforce the solder, thereby allowing higher solder pedestals and more elasticity. Another solution includes spirally wrapping wire around the outside of the solder. A further solution put forth in U.S. Pat. No. 5,316,788 includes providing a combination of solder and high-lead solder. Still other prior art solutions make use of an underfill material disposed between the semiconductor chip and the supporting substrate which allows the stress caused by the thermal mismatch to be more uniformly spread out over the entire surface of the solder connection. All of these prior art solutions are aimed at improving the reliability of solder connections; however, each of these solutions encounters significant problems such as insufficient compliancy between the semiconductor chip and the PCB Several inventions, commonly assigned to the assignee of the present invention, deal effectively, with the thermal mismatch problem. For example, U.S. Pat. No. 5,148,266 discloses improvements in semiconductor chip assemblies and methods of making the same. In certain embodiments of the '266 patent, a semiconductor chip can be connected to a substrate using a sheet-like, and preferably flexible, interposer. The interposer overlies the top, contact-bearing surface of the chip. A first surface of the interposer faces towards the chip whereas a second surface faces away from the chip. Electrical terminals, which can be bonded to a substrate, are provided on the second surface of the interposer, and the interposer is provided with apertures extending through it. Flexible leads extend through the apertures, between the terminals on the second surface of the interposer and the contacts on the chip. Because the terminals are movable relative to the contacts on the chip, the arrangements described in the '266 patent provide excellent resistance to differential expansion of the chip relative to the substrate caused by thermal cycling. The interposer disclosed in the '266 patent may also include a compliant layer disposed between the terminals and the chip.

Commonly assigned U.S. patent application Ser. No. 08/123,882, filed Sep. 20, 1993 (now U.S. Pat. No. 5,477,611), the disclosure of which is incorporated herein by reference, discloses a method for creating an interface between a chip and chip carrier including spacing the chip a given distance above the chip carrier, and introducing a liquid in the gap between the chip and carrier. Preferably, the liquid is a curable material which is cured into a resilient layer such as an elastomer after its introduction into the gap. In a preferred embodiment, the terminals on a chip carrier are planarized or otherwise vertically positioned by deforming the terminals into set vertical locations with a plate, and a liquid is then cured between the chip carrier and chip.

Copending, commonly assigned U.S. patent application Ser. No. 08/365,699 entitled "Compliant Interface for a Semiconductor Chip and Method Therefor" filed Dec. 29, 1994, the disclosure of which is incorporated herein by reference, discloses a method of fabricating a compliant interface for a semiconductor chip, typically comprised of a compliant encapsulation layer having a controlled thickness. In certain preferred methods according to the '699 application, a first support structure, such as a flexible, substantially inextensible dielectric film, is provided. A resilient element, such as a plurality of compliant pads, is attached to a first surface of the first support structure, with any two adjacent compliant pads defining a channel therebetween. Attaching the compliant pads to the first support structure may be accomplished in a number of different ways. In one embodiment, a stencil mask having a plurality of holes extending therethrough is placed on top of the first surface of the support structure. The holes in the mask are then filled with a curable liquid, such as a silicone. After the mask has been removed, the curable liquid is at least partially cured to form an elastomer, such as by heating or by exposure to ultraviolet light. Thus, there is provided an assembly which includes a plurality of compliant pads having channels between adjacent pads.

In a further preferred embodiment of the '699 application, the assembly including the plurality of compliant pads is used with a second support structure such as a semiconductor chip having a plurality of contacts on a first surface. The first surface of the chip is abutted against the plurality of compliant pads and the contacts are electrically connected to a corresponding plurality of terminals on a second side of the support structure. Typically, the first surface of the chip is pressed against the array of compliant pads by a platen engaged with the terminals, thereby assuring the planarity of the first support structure, or flexible dielectric film. A compliant filler such as a curable liquid is then injected into the channels between the chip and the support structure and around the compliant pads while the chip and support structure are held in place. The filler may then be cured to form a substantially uniform, planar, compliant layer between the chip and the support structure. Preferred embodiments of the '699 application provide a compliant, planar interface which effectively accommodates for the thermal coefficient of expansion mismatch between the chip and a supporting substrate thereby alleviating much of the stress on the connections therebetween. Further, the combination provides an effective encapsulation barrier against moisture and contaminants.

Commonly assigned U.S. Pat. No. 5,548,091 describes other methods of bonding compliant elements to the chip and support structure using adhesives. In certain preferred methods according to the '091 patent, a support structure such as a dielectric film is provided with a prefabricated compliant layer. The compliant layer in turn has an adhesive on its surface remote from the dielectric film. The semiconductor chip is placed in contact with the adhesive, and the adhesive is activated to bond the chip to the compliant layer. The adhesive may be provided in a non-uniform layer to facilitate release of air during the bonding process and thus prevent void formation. Known adhesives tend to delaminate from the resilient element under the extreme stresses of temperature and humidity and also under stress of extreme thermal mismatch. Accordingly, still further improvements directed toward providing a resilient element that can be more effectively bonded to microelectronic elements using known adhesives would be desirable.

Despite the positive results of the aforementioned commonly owned inventions, the disclosures of which are incorporated herein by reference, still further improvements would be desirable.

SUMMARY OF THE INVENTION

One aspect of the present invention provides a method of making microelectronic assemblies. A method in accordance with this aspect of the invention includes the steps of providing first and second microelectronic elements having electrically conductive parts, juxtaposing the first and second elements with one another and bonding electrically conductive parts of the microelectronic elements to one another to form electrical interconnections. For example, the first element may be a flexible dielectric interposer with terminals and leads thereon, whereas the second element may include one or more semiconductor chips having contacts thereon. The leads may be bonded to the contacts so as to connect the terminals with the contacts.

The method also includes the step of providing one or more porous resilient elements having one or more tacky surface regions in contact with one or more liners separately from the first and second microelectronic elements, assembling the resilient elements with at least one of the microelectronic elements and removing the resilient element from the one or more liners prior to the juxtaposing step so that the resilient elements are disposed between the microelectronic elements after the juxtaposing and bonding steps. In accordance with this step, the resilient element is removed from storage and before applying the resilient element to the surface of a first microelectronic element a first liner film is removed from the resilient element to expose a first tacky surface region. In order to reduce the adhesion between the liner and the resilient element, heat may be applied to the liner to soften the tacky surface region of the resilient element in contact with the liner. The resilient element is then assembled to a first microelectronic element so that the first tacky surface region of the resilient element is in contact with the first microelectronic element. The second liner film is then removed from the resilient element to expose a second tacky surface region and the second surface region is then assembled to a second microelectronic element.

The resilient elements may include a tacky material, such as an adhesive, in contact with the first and second tacky surface regions. The tacky material may be provided at the surface regions of the resilient element during fabrication thereof or just prior to assembly of the resilient element with microelectronic elements. Alternatively, the tacky material may be provided on the microelectronic elements themselves prior to their being assembled with the resilient element. In another embodiment, the resilient element is partially-cured and has first and second surface regions which are not fully cured. In this embodiment, the first and second surface regions are in contact with a cure-inhibiting material while the resilient element is in storage. The partially-cured aspect of the present invention incorporates the realization that once a resilient element is fully cured, it is difficult to later effectively bond the resilient element to a microelectronic element. Although the present invention is not limited by any theory of operation, it is believed that these difficulties result from the fact that once a resilient element is fully cured, many adhesives cannot wet to the resilient element and thus the adhesives are unable to chemically bond the resilient element. As a result, there is only surface adhesion between the resilient element and the adhesive and this forms a weak bond between the resilient element and the microelectronic elements. Thus, by providing resilient elements having wettable surface regions, the difficulties associated with creating an effective bond between the resilient element and the adhesive are substantially eliminated.

In other embodiments, the method of making microelectronic assemblies includes providing a resilient element having one or more tacky surface regions separately from first and second microelectronic elements, and assembling the resilient element with at least one of the microelectronic elements prior to the juxtaposing step so that the resilient element is disposed between the microelectronic elements after the juxtaposing and bonding steps. The step of assembling the resilient element with at least one of the microelectronic elements is preferably performed just shortly before the step of bonding the conductive parts to one another, typically less than 24 hours before the bonding step and most preferably less than one hour before the bonding step. This particular aspect of the invention incorporates the realization that the manner in which a resilient element is applied to a microelectronic element can affect the bonding operation. Thus, where resilient elements are applied to a microelectronic element, such as a flexible interposer, and the subassembly is stored for a prolonged period and then assembled to another microelectronic element, difficulties can arise in the bonding process used to join the electrically conductive parts to one another. It is generally accepted that these difficulties result from low-molecular-weight substances included in the resilient element exuding from the resilient element and contaminating the electrical parts. For example, where a resilient element incorporating silicone compounds is present on an interposer for many months, the silicone may contaminate the leads of the interposer. This retards sonic or thermosonic bonding of the leads to contacts on a chip, and requires extra care in the bonding operation to assure satisfactory quality. By providing the resilient element separate from the microelectronic elements to be assembled, contamination of the conductive parts during storage is substantially eliminated and the formation of a satisfactory bond between the contacts and leads may be achieved.

In one embodiment, the porous resilient element includes a plurality of compliant pads whereby adjacent pads define channels running between the pads. In accordance with this particular embodiment, after the bonding step for connecting the electrical parts, a liquid encapsulant may be applied to fill the channels between adjacent pads, as described in the '699 application. In a further embodiment, the resilient element includes a web interconnecting the plurality of compliant pads. In yet another embodiment, the resilient element includes elongated resilient strips which are oriented along the length-wise axis of the liner holding the strips.

Another aspect of the present invention provides methods of making resilient elements having one or more tacky surface regions. The resilient elements which are provided by these methods can be used in processes as described above, and in other processes for fabricating microelectronic packages. In a preferred method according to this aspect of the invention, a first liner including a tacky material is provided. The tacky material may be an adhesive, such as a pressure sensitive adhesive, or any other known material which may provide tack to the surface regions of the resilient element. A mass of a curable material, such as a silicone elastomer, is then screened or stencil printed onto the first liner so that a first surface region of the curable material is in contact with the first storage liner. A second storage liner including the tacky material may be abutted against a second surface region of the curable material so that the tacky material is in contact with the first and second surface regions of the curable material. The curable material is then subjected to a curing process which transforms the mass into a resilient element having first and second tacky surface regions. In another embodiment, only one liner having a tacky material is used to provide a resilient element having one tacky surface region. In further embodiments, the first liner may have a surface treatment formed thereon which ensures that the level of adhesion between the first liner and the resilient element is lower than the level of adhesion between the second liner and the resilient element so that the resilient element stays on the second liner when the first liner is being removed. It is also contemplated that the resilient element may be provided by cutting the resilient element out of a larger sheet of cured resilient material using a die press or a roll punch. In this embodiment, the die press or roll punch perforates the sheet to provide cut-out resilient elements which may be utilized as described above. The resilient element is then stored separate and apart from the microelectronic elements comprising the microelectronic package, for the reasons set forth above. Based upon such factors as the length of time that the resilient elements will be stored before being used and the nature of the microelectronic elements to which the resilient elements will be assembled, the resilient elements can be stored at different temperatures, such as room temperature or a cold storage temperature, and under different conditions.

Another aspect of the present invention provides methods of making a resilient element having one or more tacky surface regions whereby the resilient element may be a partially-cured resilient element having regions with different degrees of cure. The resilient elements which are provided by these methods can be used in the processes described above, and in other processes for fabricating microelectronic packages. In a preferred method according to this aspect of the invention, a first liner including a cure-inhibiting material is provided. A mass of a curable material, such as a silicone elastomer, is then screened or stenciled onto the first storage liner so that a first surface region of the mass is in contact with the first storage liner and an interior region of the mass is remote from the liner. The cure-inhibiting material, which may be an amine or chelating agent, inhibits complete curing of portions of the mass in contact with the cure-inhibiting material. A second storage liner, including a layer of a cure-inhibiting material may then be abutted against a second surface region of the mass so that the cure-inhibiting material of the first and second liners is in contact with the first and second surface regions of the mass, respectively. The mass is then subjected to a curing process which transforms the mass into a partially-cured resilient element having regions with different degrees of cure whereby the first and second surface regions of the resilient element which are in contact with the cure-inhibiting material have lesser degrees of cure than an interior region of the resilient element which is not in contact with the cure-inhibiting material. In another embodiment, only one liner having a cure-inhibiting material is used to provide a partially-cured resilient element having a first surface region which is cured to a lesser degree than the interior region of the resilient element. The partially-cured resilient element is then stored separately from the microelectronic elements comprising the microelectronic package, for the reasons set forth above.

In order to assemble a microelectronic package using the partially-cured resilient element described above, the resilient element is first removed from storage. Before assembling the partially-cured resilient element with a microelectronic element, a first liner film is removed from the resilient element to expose a first partially-cured surface region thereof. A catalyst or curing agent, such as a platinum-based curing agent, is then applied to the partially-cured resilient element, or one or both of the microelectronic elements and the resilient element is then assembled to a first microelectronic element so that the first surface region of the resilient element is in contact with the curing agent. In a similar fashion, the second liner film is removed from the partially-cured resilient element to expose a second surface region and the resilient element is then assembled to a second microelectronic element so that the second surface region of the resilient element is in contact with the curing agent. Most preferably, the step of assembling the partially-cured resilient element with at least one of the microelectronic elements is performed just shortly before the step of bonding the conductive parts to one another, typically less than 24 hours before the bonding step and most preferably less than one hour before the bonding step. Most preferably, the method according to this aspect of the invention further includes the step of additionally curing the resilient element after the assembling step, while the resilient element is in engagement with one or both of the microelectronic elements, as by applying a chemical curing agent or energy such as heat, ultraviolet or other radiant energy. In a further step, after bonding of the electrical parts, a liquid encapsulant may be applied to fill the spaces between the microelectronic elements and around the resilient element.

In another embodiment of a method of making the resilient elements described above, a liner film has first and second surfaces. A mass of a curable material is screened or stencil printed on the first surface of the liner so that a first surface region of the mass is in contact with the first surface of the liner. The second surface of the liner is then abutted against a second surface region of the mass which is remote from the first surface region of the mass. The above steps are performed repeatedly so as to provide a plurality of curable masses in engagement with the first liner. The method further includes the step of winding the first liner in a spiral to engage each one of the plurality of curable masses between the first surface of the liner on one turn of the spiral and the second surface of the liner on another turn of the spiral. The second surface of the liner may have a surface treatment formed thereon which ensures that the level of tack between the resilient element and the second surface of the liner is lower than the level of tack between the liner and the first surface of the resilient element. Thus, the resilient element will stay on the first liner when the second surface is being pulled away from the resilient element to prepare the resilient element for assembly to a microelectronic element. One such tack-reducing surface treatment is a synthetic flourine-containing resin sold under the trademark Teflon®. In this embodiment, only one liner is required to cover both the first and second surface regions of the resilient element and the resilient elements are stored in a spiral-shaped configuration. In one preferred embodiment according to this invention, a tacky material such as a pressure sensitive adhesive is provided at the first and second surface regions. In another embodiment, the cure-inhibiting material described above is provided at the first and second surface regions of the resilient element to inhibit the cure of the first and second surface regions.

A further embodiment of the present invention provides resilient elements which can be either a plurality of compliant pads (i.e., a matrix of dots), whereby any two adjacent pads define a channel therebetween; a plurality of compliant pads connected by a web; a sheet having a plurality of compliant pads formed on opposite sides of the sheet; elongated resilient strips which are oriented in a direction parallel to the longitudinal axis of the storage liner; or a unitary structure having a square or rectangular shape. These resilient elements can be used in processes as described above, and in other processes for fabricating microelectronic packages. According to this aspect of the invention, the resilient elements are stored and shipped with liner films applied to the surface regions thereof. The liner films protect the surface regions from contamination and are further treated with a material for providing the surface regions with tack. For example, an adhesive material may be provided on the liners in contact with the surface regions of the resilient element, or a cure-inhibiting material may be provided on the liners to prevent curing of the surface regions of the resilient element. The resilient element with liners attached can then be stored separately from microelectronic elements until immediately before the juxtaposing, assembling and bonding steps described above. With respect to the use of a cure-inhibiting material, if a mass of curable elastomer, such as curable silicone, is exposed to the cure-inhibiting material during a curing process, then that portion of the mass in contact with the cure-inhibiting material will cure to a lesser degree than an interior region of the mass which is not in contact with the cure-inhibiting agent, e.g., the surface regions of the resilient element in contact with the cure-inhibiting agent will be cured to a lesser degree than the interior region of the resilient element.

The foregoing and other objects and advantages of the present invention will be better understood from the following detailed description of a preferred embodiment taken together with the attached figures.

DETAILED DESCRIPTION OF A PREFERRED EMBODIMENT

Figure 1:
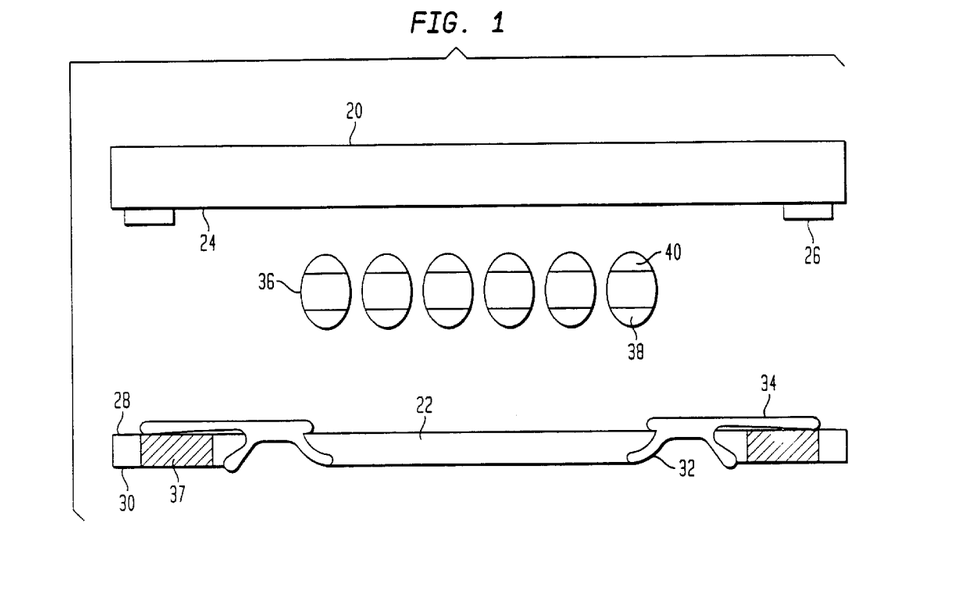
FIG. 1 shows a side view of a microelectronic package including a resilient element comprising a plurality of compliant pads prior to assembly of the package, according one embodiment of the present invention.

One embodiment of the present invention provides a method of making a microelectronic package. As shown in FIG. 1, a semiconductor chip 20 and an interposer 22 having electrically conductive parts are juxtaposed with one another before being bonded together to form a semiconductor chip package. The semiconductor chip 20 has a generally planar front face 24 including electrical parts or contacts 26 formed on peripheral regions of the front face 24. In the particular chip shown, the contacts 26 are arranged in rows (not shown) which are adjacent, and run parallel to, each edge of the chip 20. The contacts 26 in each row are spaced at very close intervals, typically about 100 to about 250 micrometers center to center. This center to center spacing is adequate for high I/O count chips used with wire bonding or tape automated bonding systems.

The interposer 22 is a sheet-like dielectric film having a first 28 and a second surface 30. The dielectric film 22 is preferably formed from a polymeric material, such as KAPTON™ (E) available from DuPont Chemical Corp. of an approximate thickness between 25 microns and 75 microns. The dielectric film 22 has conductive terminals 32 on its second surface 30, electrical parts or leads 34 extending from the terminals 32 for electrically connecting the terminals 32 to the contacts 26 on the semiconductor chip 20, and bond windows 37 for accessing the leads 34 while electrically connecting the leads 34 with the contacts 26.

Prior to juxtaposing and bonding the semiconductor chip 20 with the interposer 22, a resilient element 36 having one or more tacky surface regions is assembled to the front face 24 of the chip 20 and the first surface 28 of the interposer 22. The resilient element 36 is typically made of a curable liquid elastomer material, such as a curable silicone elastomer, and includes a first tacky surface region 38 and a second tacky surface region 40 so that the resilient element sticks to the microelectronic elements after being assembled thereto.

Figure 2:
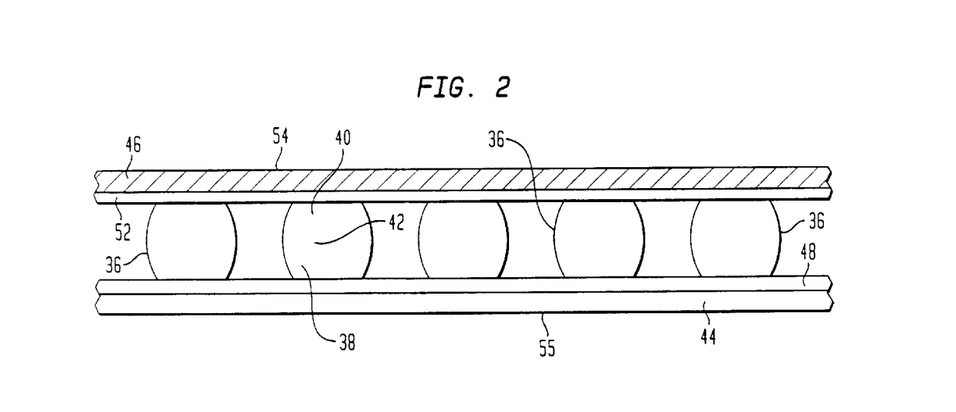
FIG. 2, shows a side view of one embodiment of a resilient element according to the present invention.

Prior to the assembly step, the resilient element 36 may be stored in an embodiment shown in FIG. 2. In this embodiment, the resilient element 36 comprises a plurality or array of compliant pads 36 stored between a first storage liner 44 and a second storage liner 46, whereby the first surface region 38 of the resilient element 36 is in contact with the first storage liner 44 and the second surface region 40 of the resilient element 36 is in contact with the second storage liner 46. The first and second liners 44, 46 include a tacky material 48, 52 formed on the respective first and second liners 44, 46. The tacky material 48, 52 provides tack to the first and second surface regions 38, 40 of the resilient element 36. The tacky material may be an adhesive, such as a pressure sensitive adhesive or other known adhesives for providing the surface regions of the resilient element with tack. Preferred embodiments for fabricating the resilient elements, as well as preferred embodiments of a transferable resilient element assembly for storing a resilient element will be discussed below in complete detail.

Figure 10:
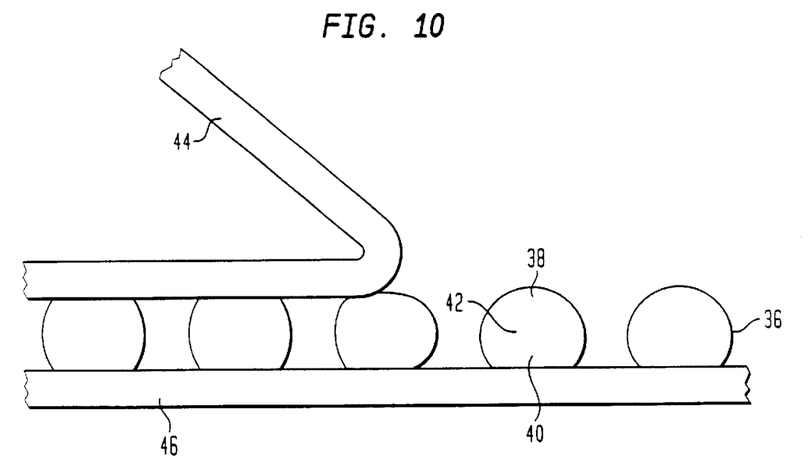
FIG. 10 shows the resilient element shown in FIG. 5 with the second liner being removed to expose the second surface region of the resilient element.

Referring to FIGS. 1 and 2, to assemble the resilient element 36 to the dielectric film 22, the first storage liner 44 is peeled away from the resilient element 36 to expose the first tacky surface region 38 thereof. Prior to peeling off the first liner 44, heat may be applied to the exterior surface 55 of the first liner 44 to reduce the level of tack between the first liner 44 and the first surface region 38 of the resilient element 36, thereby insuring that the resilient element 36 will remain on the second liner 46 until it is desirable to remove the second liner 46. After, heat has been applied, the first liner 44 should preferably be pulled at a severe angle of departure, as shown in FIG. 10, which further ensures that the resilient element 36 remains on the second storage liner 46. A surface treatment, such as a synthetic flourine-containing resin sold under the trademark Teflon®, may also be disposed between the first liner 44 and the first surface region 38 to provide a level of adhesion between the resilient element 36 and the first liner 44 which is lower than the level of adhesion between the resilient element 36 and the second liner 46. In other words, less work will be required to remove the first liner from the resilient element than will be required to remove the second liner from the resilient element. As a result, the resilient element 36 will generally remain on the second liner 46 as the first liner 44 is being removed. After the first liner 44 has been removed to expose the first tacky surface region 38 of the resilient element 36, the dielectric film 22 is abutted against the first tacky surface region 38 of the resilient element 36 to assemble the resilient element 36 to the first surface 28 of the dielectric film 22. Next, the second storage liner 46 is removed from the resilient element 36 to expose the second tacky surface region 40 of the resilient element 36. After the second liner 46 has been removed, the resilient element 36 is assembled with the front face 24 of the chip 20. The resilient element 36 is preferably aligned with the front face 24 of the semiconductor chip 20 so that no portion of the resilient element 36 covers the contacts 26.

In other preferred embodiments, the tacky material is not applied to the storage liners prior to fabrication of the resilient element but is applied after the storage liners have been removed and prior to assembly with the microelectronic elements. In a further embodiment, the tacky material is at the first surface of the interposer 22 or at the contact bearing face 24 of the chip 20, or at both surfaces, prior to assembly with the resilient element.

Referring to FIG. 1, in order to avoid contamination of the leads 34 and contacts 26, and for the reasons set forth above, the step of assembling the resilient element 36 with the chip 20 or the interposer 22 should be performed just prior to bonding the leads 34 to the contacts 26 on the chip 20. Generally, this should be done less than 24 hours before the bonding step and most preferably less than one hour before bonding the leads 34 to the contacts 26. It is preferable to assemble the resilient element 36 to the dielectric film 22 before assembling it to the semiconductor chip 20 because, inter alia, the chip 20 is relatively expensive and should only be assembled to the microelectronic package subassembly after all of the other parts have been satisfactorily assembled.

Figure 3:
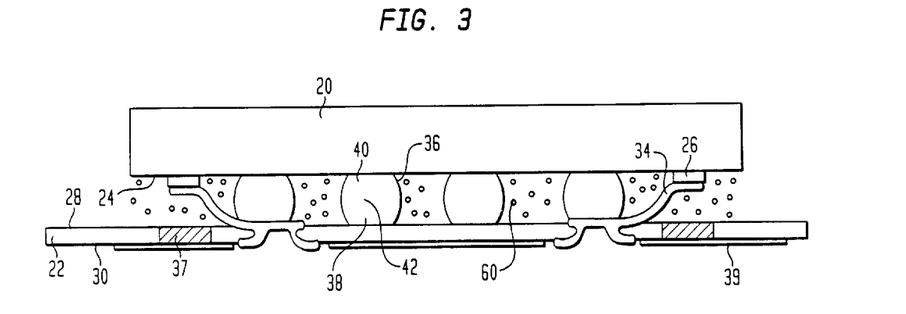
FIG. 3 shows the microelectronic package of FIG. 1 after assembly of the resilient element to the microelectronic elements.

Referring to FIG. 3, after the resilient element 36 has been assembled, each terminal 32 is connected with a contact 26 by bonding the leads 34 to the contacts 26. The terminals 32 and leads 34 may be formed from substantially any electrically conductive material, but preferably are formed from metallic material such as copper and copper alloys, noble metals and noble metal alloys and are typically fabricated by conventional photolithographic end etching or deposition techniques. The leads 34 are electrically connected to the contacts 26 on the chip 20 by a conventional wire bonding operation, or by a bonding operation as shown in U.S. Pat. Nos. 5,398,863; 5,390,844; 5,536,909 and 5,491,302.

In the next stage of the process, a low elastic modulus dielectric encapsulant or compliant filler material 60, such as a liquid silicone rubber or other curable liquid elastomer, is allowed to flow between the dielectric film 22 and the chip 20 and around the resilient element 36 and the leads 34 while the chip 20 and dielectric film 22 are compressed together or held in place. A mask 39 may be placed over the bond windows 37 to prevent the compliant filler from flowing through the bond windows 37 during the encapsulation process. The compliant filler 60 and the resilient element 36 are then cured by energy such as heat, ultraviolet light or other radiant energy to form a substantially uniform, planar, compliant layer between the chip 20 and a support structure. Because the compliant filer 60 is applied after bonding, there is no risk of the compliant filler 60 coming in contact with the leads 34 or contacts 26 before bonding, which could diminish the strength of the bond.

Figure 4:
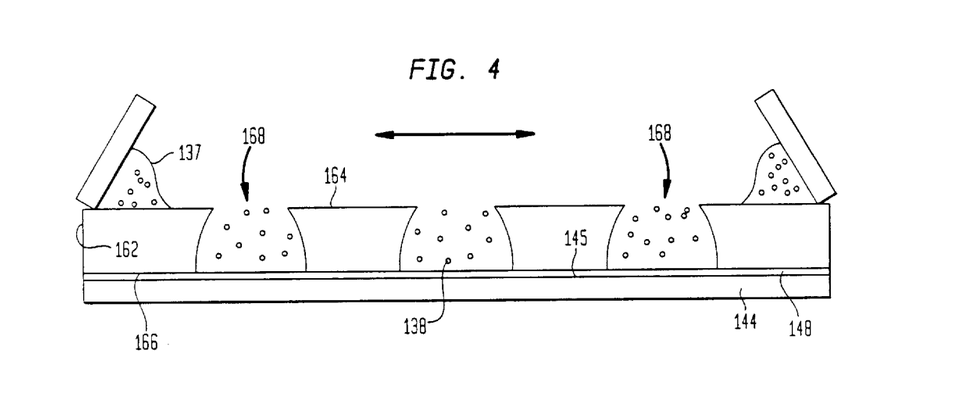
FIG. 4 shows a side view of the mask and curable elastomer used to form the resilient element shown in FIG. 2.
Figure 5:
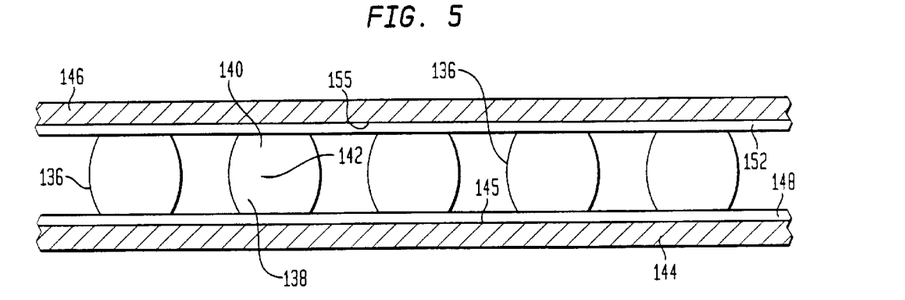
FIG. 5 shows another embodiment of a resilient element according to the present invention.

Referring to FIGS. 4–5, in a method according to another embodiment of the invention, a resilient element comprising a plurality of compliant pads 136 having one or more tacky surface regions is formed. A first liner 144 having a first surface 145 is provided. The first liner 144 is a thin, flexible sheet which may be formed from materials such as paper or plastic. The first liner 144 includes a tacky material 148 which provides a level of tack to a first surface region 138 of the resilient element. The tacky material 148 may be an adhesive, such as a pressure sensitive adhesive, and may be provided as a thin film formed on the first surface 145 of the first liner 144; however, it is also contemplated that the first liner 144 may be fabricated so that the tacky material 148 is present throughout the liner 144 and at all surfaces of the liner 144.

Referring to FIG. 4, the resilient element 136 is generally formed by providing a mass 137 of a curable liquid elastomer material such as the Dow Corning silicon elastomer 577, known as SYLGARD™. The mass 137 is generally provided on the first liner by using a stencil mask 162 having top 164 and bottom surfaces 166 and further having a plurality of holes 168 extending therethrough. The bottom surface 166 of the mask 162 is placed atop the cure-inhibiting material 148 on the first surface 145 of the first liner 144 and the mass 137 wiped or screened across the first surface 164 of the mask 162 so that the mass 137 is deposited into each of the holes 168. If the mass 137 is viscous or thixotropic enough, then the mask 162 is removed to leave a plurality of pads 136 which will later be cured to form the resilient element 136, as shown in FIG. 5.

Referring to FIG. 5, a second storage liner 146, which is substantially similar to the first storage liner 144, is provided. The second storage liner 146 has a first surface 155 and includes a tacky material 152 formed as a thin film at the first surface 155. The second storage liner 146 is placed over the mass 136 and is in contact with the second surface region 140 of the mass 136. The mass 136, while in contact with the first and second liners 144, 146, is then subjected to a curing process to provide a resilient element 136 having first and second tacky surface regions 138, 140. It is also contemplated that only one of the surface regions of the resilient element may have a tacky material. In the case of Dow 577 elastomer, the elastomer is typically heated to approximately 125 degrees centigrade for 40 minutes. Curing the mass 136 while the mass 136 is in contact with the tacky material 148, 152 promotes the formation of a strong bond between the resilient element 136 and the tacky material 148, 152. The assembly may be stored at room temperature or placed in cold storage. The storage conditions may change based upon such factors as the length of time that the assembly will be stored and the nature of the materials used to fabricate the assembly. A layer of a releasing material, such as Teflon®, may be formed between the first liner 144 and the first surface region 138 of the resilient element 136 so that the first liner 144 can be easily removed without simultaneously pulling the resilient element 136 off of the second liner 146.

Figure 6:
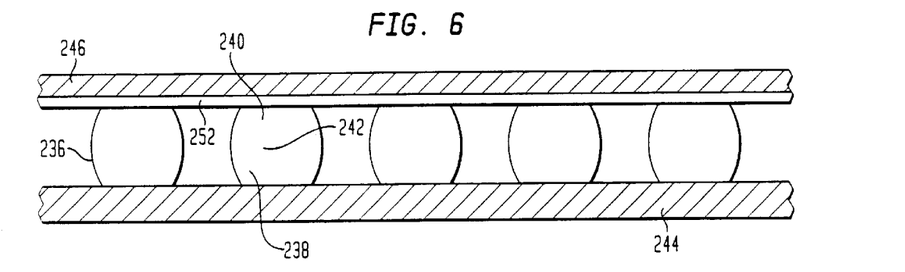
FIG. 6 shows a further embodiment of a resilient element according to the present invention.

FIG. 6 shows another embodiment of the assembly shown in FIG. 5 whereby only one of the liners is provided with a tacky material and the resilient element has only one tacky surface region. The resilient element 236 is disposed between a first liner 244 and a second liner 246. A first surface region 238 of the resilient element 236 is in contact with the first liner 244 and a second surface region 240 is in contact with a second liner 246 including a tacky material 252. In this embodiment, after curing, the resilient element 236 is substantially cured and only the second surface region 240, that portion in contact with the tacky material 252 provided at the second liner 246, is tacky. It is also contemplated that the first liner 244 may be a microelectronic element such as an interposer or flexible tape, whereby during final assembly of a microelectronic package the resilient element 236 is assembled to one additional microelectronic element.

Figure 7:
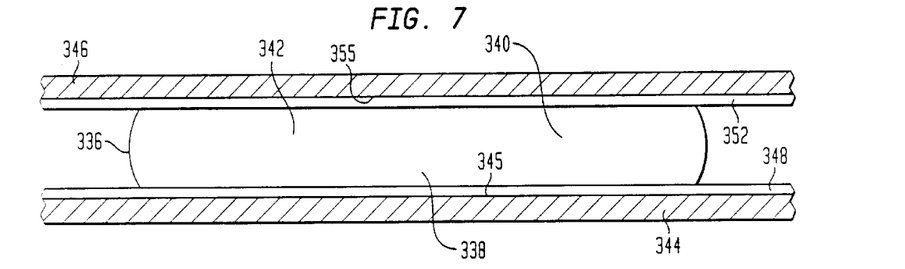
FIG. 7 shows still a further embodiment of a resilient element according to the present invention.

FIG. 7 shows an embodiment in which the resilient element 336 is a unitary pad having a square or rectangular shape. The resilient element 336 has an interior region 340 and first and second surface regions 338, 342 which are tacky. The resilient element 336 is stored between first and second liners 344, 346 having a tacky material 348, 352 provided at first surfaces of the respective liners 344, 346. The unitary pad 336 can be assembled between an interposer and chip to provide a complete compliant layer as described above.

Figure 8:
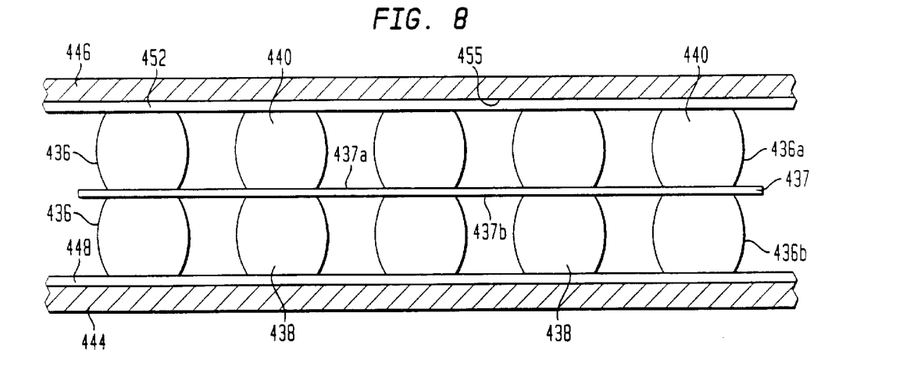
FIG. 8 shows yet another embodiment of a resilient element according to the present invention.

FIG. 8 shows yet another embodiment in which the resilient element 436 comprises a sheet 437 comprising a plurality of compliant pads 436 formed upon and extending from opposite sides of the sheet 437. The resilient element 436 has a first set of compliant pads 436a formed upon a first face 437a of the sheet 437 and a second set of compliant pads 436b formed on a second face 437b of the sheet 437. The resilient element 436 is stored between first and second liners 444, 446 having a tacky material 448, 452 provided at first surfaces of the respective liners 444, 446.

Figure 9:
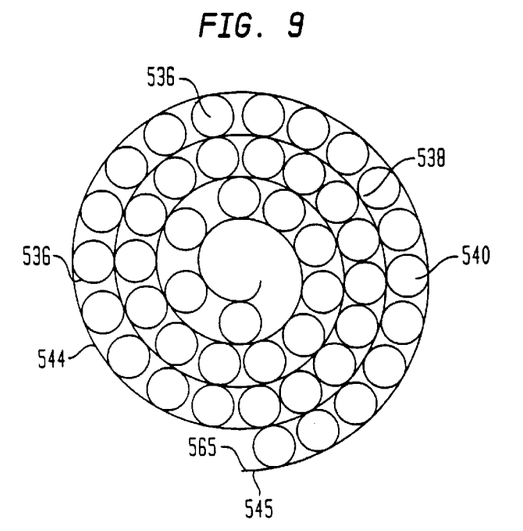
FIG. 9 shows a resilient element comprising a plurality of compliant pads stored in a spiral configuration, according to yet another embodiment of the present invention.

FIG. 9 shows a further embodiment in which the resilient element comprises a plurality of compliant pads 536 stored in a spiral configuration or assembly. In this embodiment, the liner 544 has a first surface 545 for receiving and having formed thereon the mass of curable material in accordance with the stencil mask methods described above so that the first surface region 538 of the mass is in contact with the first surface 545 of the liner 544. The method further includes the step of abutting a second surface of the first liner against a second surface region the curable material which is remote from the first surface region. The above steps are then performed repeatedly to provide a plurality of curable material masses in engagement with the first liner. The first liner is wound in a spiral to engage each one of the plurality of curable masses between the first surface of the liner on one turn of the spiral and the second surface of the liner on another turn of the spiral. The mass is then cured as described above to provide a plurality of compliant pads which are stored in a spiral configuration. A tacky material (not shown) may be provided at either or both of the first or second surface regions 538, 540 to provide tack to the first and second surface regions 538, 540 in contact with the tacky material. During assembly of a microelectronic package, the second surface of the liner is removed from the resilient element to prepare the resilient element for assembly to a microelectronic element. A Teflon® coating is disposed between the second surface 565 of the liner 544 and the second surface region 540 of the resilient element 536 to reduce the level of tack therebetween so that the pads will remain on the first surface 545 of the liner 544 as the spiral is unwound. The liner 544 can be cut at various points to select the exact number of resilient elements needed for the assembly step described above.

Figure 11:
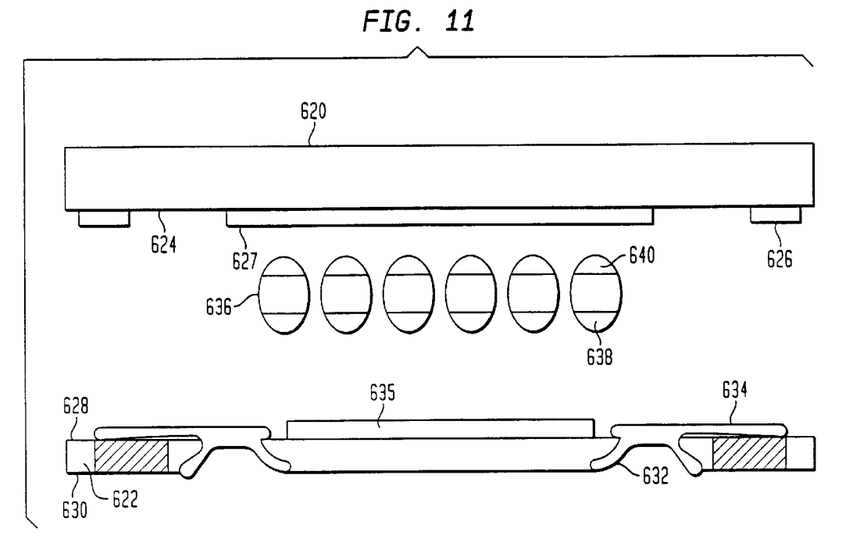
FIG. 11 shows a side view of a microelectronic package including a partially-cured resilient element prior to assembly of the package, according to another embodiment of the present invention.
Figure 12:
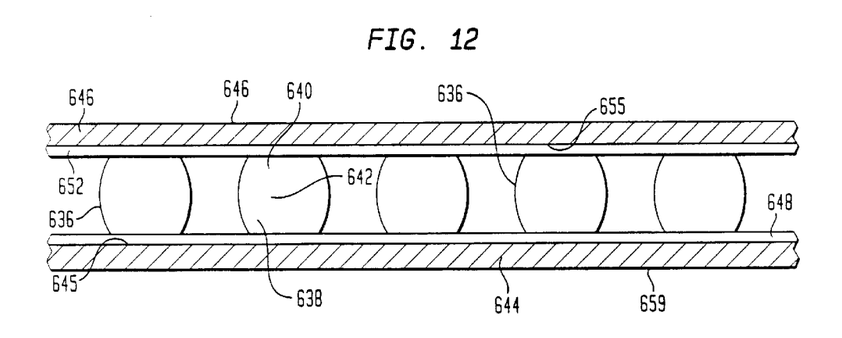
FIG. 12 shows a side view of the resilient element shown in FIG. 11 prior to assembly with a microelectronic package.

Referring to FIGS. 11–12, in a method according to another embodiment of the invention, a resilient element having one or more tacky surface regions is formed whereby the resilient element 636 is partially cured and has regions with different degrees of cure. In accordance with this embodiment, a first liner 644 having a first surface 645 is provided. The first liner 644 is a thin, flexible sheet, as described above, and includes a cure-inhibiting material 648 which inhibits curing of a first surface region 638 of the resilient element 636 which is in contact with the first liner 644. The cure-inhibiting material 648 is typically an amine or chelating agent; however, it may also comprise any other known cure-inhibiting agents. The cure-inhibiting material 648 may be provided as a thin film formed on the first surface 645 of the first liner 644; however, it is also contemplated that the first liner 644 may be fabricated so that the cure-inhibiting material 648 is present throughout the liner 644 and at all surfaces thereof. The partially-cured resilient element 636 according to this embodiment is generally formed by providing a mass of a curable liquid elastomer material on the first liner by using the stencil mask process described above.

After the curable liquid elastomer material is provided on the first liner, a second storage liner 646, which is substantially similar to the first storage liner 644, is provided. The second storage liner 646 has a first surface 655 and includes a cure-inhibiting material 652 formed at the first surface 655. The second storage liner 646 is placed over the mass 636 and is in contact with the second surface region 640 of the mass 636. The mass 636, while in contact with the first and second liners 644, 646, is then subjected to the curing process described above to provide a partially-cured resilient element 636 whereby the interior region 642 of the resilient element 636 is substantially cured and the first and second surface regions 638, 640 of the resilient element 636 are partially cured. Thus, the first and second surface regions 638, 640 are cured to a lesser degree than the interior region 642 and the degree of cure reduces as one moves outward from the interior region 642 toward the surface regions 638, 640. It is also contemplated that one of the surface regions may be cured to a lesser degree than the other surface region or that the entire resilient element may be partially-cured.

Referring to FIG. 12, to assemble the partially-cured resilient element 636 to microelectronic elements, the first storage liner 644 is peeled away from the resilient element 636 to expose the first surface region 638 thereof. Prior to peeling off the first liner 644, heat is applied to the exterior surface 659 of the first liner 644 to reduce the level of tack between the first liner 644 and the first surface region 638 of the resilient element 636 so that the resilient element 636 will remain on the second liner 646 until it is desirable to remove the resilient element from the second liner 646. After, heat has been applied to the first liner 644, the liner 644 should preferably be pulled at a severe angle of departure, as described above with reference to FIG. 10, in order to further insure that the resilient element 636 remains on the second storage liner 646. A surface treatment, such as a synthetic flourine-containing resin sold under the trademark Teflon®, may also be disposed between the first liner 644 and the first surface region 638 to reduce the level of tack. After the first liner 644 has been removed to expose the first surface region 638 of the resilient element 636, the dielectric film 622 including a curing agent 635 formed thereon (such as a platinum curing agent) is abutted against the first surface region 638 of the resilient element 636 to assemble the resilient element 636 to the dielectric film 622 so that the curing agent 635 at the first surface 628 of the dielectric film 622 is in contact with the first surface region 638 of the resilient element 636. After the resilient element 636 has been assembled to the dielectric film 622, the second storage liner 646 is removed from the second surface region 640 of the resilient element 636 to expose the second surface region 640 of the resilient element 636. After the second liner 646 has been removed, the resilient element 636 is assembled with the front face 624 of the chip 620 so that the curing agent 627 in contact with the second surface region 640 of the resilient element 636 promotes curing of the second surface region 640. In another preferred embodiment, the curing agent is not provided at the contact bearing face 624 of the chip 620 or at the first surface 628 of the interposer 622, but is applied to one or both of the partially-cured surface regions of the resilient element prior to assembly with the microelectronic elements.

The step of assembling the partially-cured resilient element 636 with the interposer 622 or the chip 620 should be performed just prior to bonding the leads 634 to the contacts 626 on the chip 620, preferably less than 24 hours before the bonding step, and most preferably less than 1 hour before the bonding step, as described above. After assembling the resilient element 636 to the interposer 622 and the chip 620, the partially-cured resilient element 636 is additionally cured to cure the first and second surface regions 638, 640 of the resilient element 636. Curing can be performed by applying a chemical curing agent or energy such as heat, ultraviolet light or other radiant energy.

After the resilient element 636 has been assembled and additionally cured, each terminal 632 is connected with a contact 626 by bonding the leads 634 to the contacts 626, as described above. A low elastic modulus dielectric encapsulant (not shown) may then be allowed to flow between the dielectric film 622 and the chip 620 and around the resilient element 636 and the leads 634 while the chip 620 and dielectric film 622 are compressed together or held in place. The compliant filler is then cured by energy such as heat, ultraviolet light or other radiant energy to form a substantially uniform, planar, compliant layer between the chip 620 and a support structure. In another embodiment, the first and second surface regions 638, 640 of the resilient element and the compliant filler are cured simultaneously.

Figure 13:
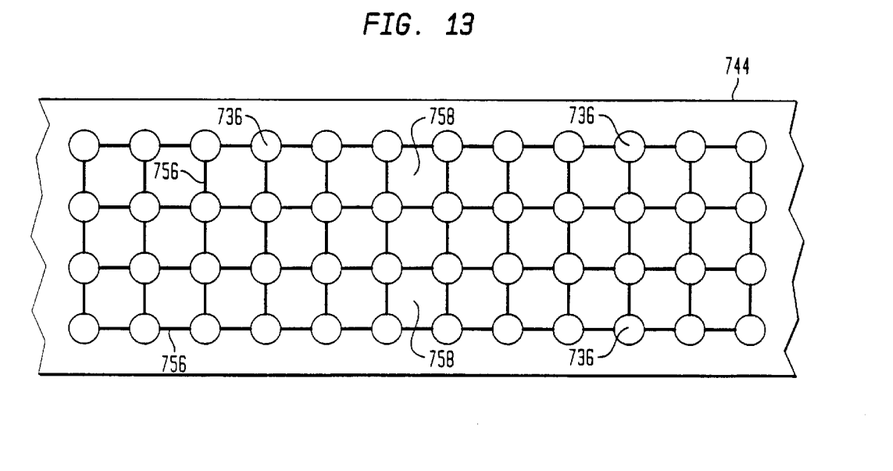
FIG. 13 shows a top view of still another embodiment of a resilient element according to the present invention.

FIG. 13 shows another embodiment according to the present invention wherein the resilient element includes a plurality of compliant pads 736 and a web 756 interconnecting the plurality of compliant pads 736 with one another whereby the pads 736 define channels 758 therebetween. The pads 736 are provided on a first storage liner 744 and in certain embodiments a second liner (not shown) may be provided over surface regions of the pads 736 remote from the first liner 744. The web 756 holds the plurality of compliant pads 736 together as the liner(s) are removed prior to the assembling step set forth above.

Figure 14:
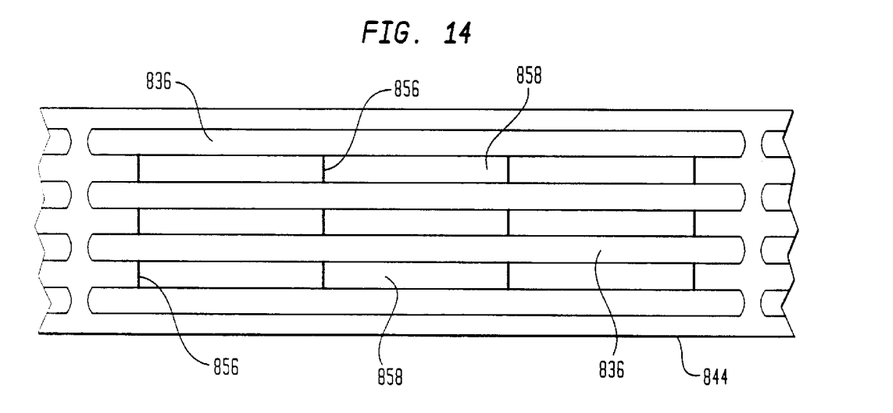
FIG. 14 shows a top view of a further embodiment of a resilient element according to the present invention.

FIG. 14 shows a further embodiment according to the present invention wherein the resilient element includes elongated resilient strips 836 and a web 856 interconnecting the elongated resilient strips 836 with one another, whereby the strips 836 define channels 858 therebetween. The resilient strips 836 are provided on a first storage liner 844 and a second liner (not shown) may also be provided over surface regions of the strips remote from the first liner 844. The elongated resilient strips are oriented in a length wise direction which runs parallel to the longitudinal axis of the storage liner 844. The web 856 holds the strips 836 together as the liner(s) are removed prior to the assembling step set forth above.

As will be readily appreciated, numerous other variations and combinations of the features discussed above may be employed without departing from the present invention. For example, a cure-inhibiting material can be provided with the embodiments shown in FIGS. 6–9 to inhibit curing of surface regions of the resilient elements depicted therein. In addition, the resilient elements may be provided by cutting the resilient elements from a sheet of cured resilient material using a die press or a roll punch. Thus, the foregoing description of the preferred embodiments should be taken by way of illustration, rather than by way of limitation, of the features discussed above.

What is claimed is:

1. A transferable resilient element assembly for fabricating a microelectronic package comprising:

a first liner including a tacky material; and a plurality of resilient elements, said plurality of resilient elements having a first surface being in contact with said first liner, said plurality of resilient elements adhering to said tacky material so that upon removal of said plurality of resilient elements from said liner said tacky material will adhere to said plurality of resilient elements and provide a tacky surface thereon.

2. The assembly as claimed in claim 1, wherein said tacky material includes an adhesive.

3. The assembly as claimed in claim 2, wherein said adhesive includes a pressure sensitive adhesive.

4. The assembly as claimed in claim 1, wherein said plurality of resilient elements comprise a porous resilient layer.

5. The assembly as claimed in claim 4, wherein said porous resilient layer includes a plurality of compliant pads.

6. The assembly as claimed in claim 5, wherein said porous resilient layer further includes a web interconnecting said plurality of compliant pads with one another so that said pads define channels therebetween.

7. The assembly as claimed in claim 1, further comprising a second liner including said tacky material being abutted against a second surface region of said plurality of resilient elements remote from said first surface region, wherein said second surface region is in contact with the second liner.

8. The assembly as claimed in claim 7, wherein the level of adhesion between the first liner and said first surface region of said plurality of resilient elements is lower than the level of adhesion between the second liner and said second surface region of said plurality of resilient elements.

9. The assembly as claimed in claim 1, wherein said first liner includes a first surface and a second surface, the second surface of said liner being abutted against a second surface region of said plurality of resilient elements, said second surface region of said plurality of resilient elements being remote from said first surface region of said plurality of resilient elements.

10. The assembly as claimed in claim 9, wherein said plurality of resilient elements are wound in a spiral between the first surface of the liner and the second surface of the liner.

11. A transferable resilient element assembly for fabricating a microelectronic package comprising:

a first liner including a cure-inhibiting material; and a resilient element having regions with different degrees of cure being in contact with said first liner.

12. The assembly as claimed in claim 11, wherein said resilient element has a first surface region in contact with said first liner and an interior region remote from said first liner, said first surface region of said resilient element having a lesser degree of cure than said interior region of said resilient element.

13. The assembly of claim 11, wherein said cure-inhibiting material is selected from the group consisting of amines and chelating agents.

14. The assembly as claimed in claim 11, wherein said resilient element includes a porous resilient layer.

15. The assembly as claimed in claim 14, wherein said porous resilient layer includes a plurality of compliant pads.

16. The assembly as claimed in claim 15, wherein said porous resilient layer further includes a web interconnecting said plurality of compliant pads with one another so that define channels therebetween.

17. The assembly as claimed in claim 15, wherein said resilient element is a continuous resilient layer.

18. The assembly as claimed in claim 12, further comprising a second liner including a cure-inhibiting material being abutted against a second surface region of said resilient element remote from said first surface region, wherein said second surface region is in contact with the second liner.

19. The assembly as claimed in claim 18, wherein the level of adhesion between the first liner and said first surface region of said resilient element is lower than the level of adhesion between the second liner and said second surface region of said resilient element.

20. The assembly as claimed in claim 12, wherein said first liner includes a second surface being abutted against a second surface region of said resilient element, said second surface region of said resilient element being remote from said first surface region of said resilient element.

21. The assembly as claimed in claim 20, wherein a plurality of resilient elements are in engagement with said first liner, said resilient elements being wound in a spiral between the first surface of the liner and the second surface of the liner.

22. The assembly as claimed in claim 1, wherein the tacky material is a single continuous layer on said first liner.

23. The assembly as claimed in claim 2, wherein the adhesive is a single continuous layer on said first liner.

* * * * *

UNITED STATES PATENT AND TRADEMARK OFFICE
CERTIFICATE OF CORRECTION

PATENT NO.     : 6,686,015 B2
DATED          : February 3, 2004
INVENTOR(S)    : Kurt Raab and John W. Smith It is certified that error appears in the above-identified patent and that said Letters Patent is hereby corrected as shown below:

<u>Column 16,</u>
Line 9, insert -- said pads -- after "that".

Signed and Sealed this

Eighth Day of June, 2004

JON W. DUDAS
*Acting Director of the United States Patent and Trademark Office*